(12) United States Patent
Ho et al.

(10) Patent No.: US 8,174,078 B2
(45) Date of Patent: May 8, 2012

(54) FLAT-PANEL DISPLAY SEMICONDUCTOR PROCESS FOR EFFICIENT MANUFACTURING

(75) Inventors: Jackson H. Ho, Palo Alto, CA (US); Jeng Ping Lu, Fremont, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 12/946,762

(22) Filed: Nov. 15, 2010

(65) Prior Publication Data
US 2011/0057193 A1    Mar. 10, 2011

Related U.S. Application Data

(62) Division of application No. 12/331,318, filed on Dec. 9, 2008, now Pat. No. 7,863,115.

(51) Int. Cl.
*H01L 23/62* (2006.01)

(52) U.S. Cl. .......... 257/359; 257/61; 257/E21.17; 257/E21.32; 257/E21.247; 257/E21.267; 257/E21.329; 257/E21.347; 257/E21.411

(58) Field of Classification Search ......... 257/59, 257/61, 62, 63, 288, 359, E21.17, E21.32, 257/E21.247, E21.267, E21.329, E21.347, 257/E21.411
See application file for complete search history.

(56) References Cited

U.S. PATENT DOCUMENTS

| | | | |
|---|---|---|---|
| 5,817,550 A * | 10/1998 | Carey et al. | 438/166 |
| 6,680,485 B1 * | 1/2004 | Carey et al. | 257/57 |
| 7,476,601 B2 * | 1/2009 | Chao et al. | 438/487 |
| 7,863,115 B2 * | 1/2011 | Ho et al. | 438/149 |

* cited by examiner

*Primary Examiner* — David Nhu
(74) *Attorney, Agent, or Firm* — Blakely Sokoloff Taylor & Zafman

(57) ABSTRACT

An embodiment is a method and apparatus to fabricate a flat panel display. A poly-last structure is formed for a display panel using an amorphous silicon or amorphous silicon compatible process. The poly-last structure has a channel silicon precursor. The display panel is formed from the poly-last structure using a polysilicon specific or polysilicon compatible process.

10 Claims, 13 Drawing Sheets

FLAT-PANEL DISPLAY SEMICONDUCTOR PROCESS FOR EFFICIENT MANUFACTURING

CROSS-REFERENCES TO RELATED APPLICATIONS

This is a Divisional Application of U.S. patent application Ser. No. 12/331,318, filed Dec. 9, 2008, now U.S. Pat. No. 7,863,115. This Divisional Application claims the benefit of the U.S. Pat. No. 7,863,115.

TECHNICAL FIELD

The presently disclosed embodiments are directed to the field of semiconductor, and more specifically, to semiconductor process.

BACKGROUND

Flat panel displays (FPDs) have become popular in recent years, especially in the consumer electronics industry. Currently, active matrix liquid crystal display (AMLCD) is the predominant technology. In addition, Organic Light Emitting Diode (OLED) display technology is experiencing positive growth. In a typical AMLCD, an active thin film transistor (TFT) is used as an electrical switch to control each pixel in the display. There are two main process methods that are currently used for creating integrated peripheral circuits, current driving backplane such as OLED, or switches on a glass substrate that supports the fabrication of TFTs: amorphous silicon (a-Si) and polycrystalline silicon (poly-Si). The a-Si based TFTs are typically physically larger than the poly-Si TFTs because of slower electron movement. In contrast, poly-Si TFTs are smaller and faster, allowing for improved aperture ratios and higher pixel densities.

Although poly-Si process leads to higher display performance than a-Si process, a-Si fabrication process is still popular in display manufacturing facilities. This is due primarily to the relatively lower costs of a-Si that result from fewer process steps and less expensive equipment. It is, therefore, desirable to have a fabrication process that may combine the inherent low cost of a-Si manufacturing and the higher performance poly-Si process.

SUMMARY

One disclosed feature of the embodiments is a method and apparatus to fabricate a flat panel display. A poly-last structure is formed for a display panel using an amorphous silicon or amorphous silicon compatible process. The poly-last structure has a channel silicon precursor. The display panel is formed from the poly-last structure using a polysilicon specific or polysilicon compatible process.

One disclosed feature of the embodiments is a method to fabricate a flat panel display. Gate, source, and drain regions are formed on a substrate for a display panel using an amorphous silicon or amorphous silicon compatible process. The gate region corresponds to a bottom gate configuration. A channel silicon precursor is deposited on the gate, source and drain regions in the amorphous silicon or amorphous silicon compatible process. The channel silicon precursor is irradiated by a laser using a polycrystalline silicon or polycrystalline silicon compatible process.

One disclosed feature of the embodiments is a structure for a display panel. The structure includes a substrate, a bottom gate deposited on the substrate, a dielectric layer deposited on the bottom gate, source and drain doped regions deposited on the substrate and formed around the bottom gate, and a channel silicon precursor layer deposited on the patterned doped amorphous silicon layer and the dielectric layer.

One disclosed feature of the embodiments is a display panel. The display panel includes a glass substrate and a thin film transistor (TFT) array. The TFT array has a plurality of TFTs as pixel switching devices on the glass substrate. Each of the TFTs has a bottom gate structure with polycrystalline silicon and data interconnecting lines. The bottom gate structure and the data interconnecting lines are under a silicon layer.

BRIEF DESCRIPTION OF THE DRAWINGS

Embodiments may best be understood by referring to the following description and accompanying drawings that are used to illustrate various embodiments. In the drawings.

DETAILED DESCRIPTION

Figure 1:
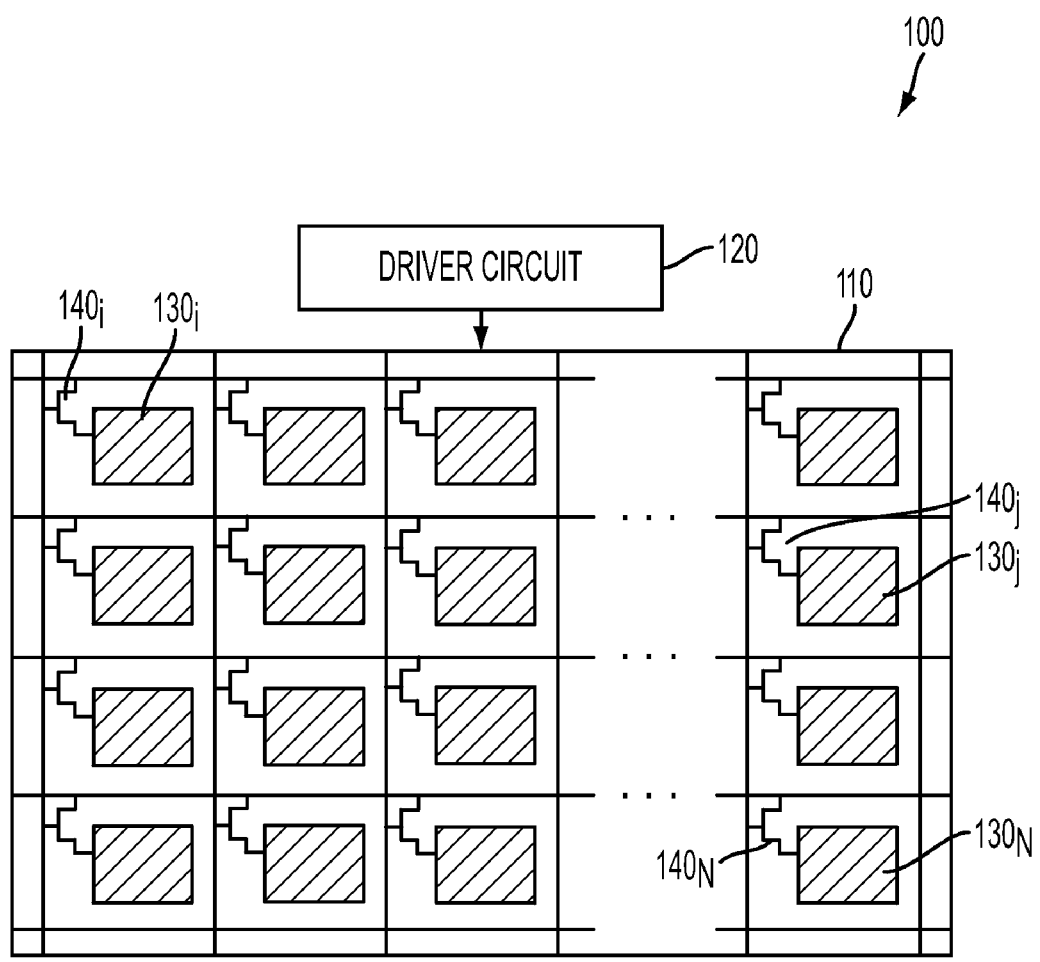
FIG. 1 is a diagram illustrating a display panel according to one embodiment.

One disclosed feature of the embodiments is a technique to fabricate a flat panel display. A poly-last structure is formed for a display panel using an amorphous silicon or amorphous silicon compatible process. The poly-last structure has a channel silicon precursor. The display panel is formed from the poly-last structure using a polysilicon specific process.

One disclosed feature of the embodiments is a method to fabricate a flat panel display. Gate, source, and drain regions are formed on a substrate for a display panel using an amorphous silicon or amorphous silicon compatible process. The gate region corresponds to a bottom gate configuration. A channel silicon precursor is deposited on the gate, source and drain regions in the amorphous silicon or amorphous silicon compatible process. The channel silicon precursor is irradiated by a laser using a polycrystalline silicon or polycrystalline silicon compatible process.

One disclosed feature of the embodiments is a structure for a display panel. The structure includes a substrate, a bottom gate deposited on the substrate, a dielectric layer deposited on the bottom gate, source and drain doped regions deposited on the substrate and formed around the bottom gate, and a channel silicon precursor layer deposited on the patterned doped amorphous silicon layer and the dielectric layer.

One disclosed feature of the embodiments is a display panel. The display panel includes a glass substrate and a thin film transistor (TFT) array. The TFT array has a plurality of TFTs as pixel switching devices on the glass substrate. Each of the TFTs has a bottom gate structure with polycrystalline silicon and data interconnecting lines. The bottom gate structure and the data interconnecting lines are under a silicon layer.

One disclosed feature of the embodiments may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc. One embodiment may be described by a schematic drawing depicting a physical structure. It is understood that the schematic drawing illustrates the basic concept and may not be scaled or depict the structure in exact proportions.

One disclosed feature of the embodiments is a method and apparatus to provide an efficient manufacture of flat panel displays. A new process architecture separates the critical silicon crystallization phase and puts it at the last phase. By doing so, the process sequence becomes an a-Si compatible process followed by a conversion phase to change a-Si TFT to poly-Si TFT. The conversion phase does not include high precision lithography tools or equipment. In one embodiment, it may involve only laser and hydrogenation tools or equipment. With the new process architecture, all existing a-Si foundries or manufacturing facilities may manufacture both a-Si and poly-Si displays with a small investment of the laser and hydrogenation tools. Accordingly, there is no need to build an expensive poly-Si facility to manufacture the TFT FPD. Alternatively, the new process architecture allows manufacturing of a portion of the TFT FPD in an a-Si manufacturing facility and the remaining process steps may be carried out at a separate poly-Si manufacturing facility. This technique avoids a large investment in building a poly-Si manufacturing facility and may capitalize the investment in the a-Si manufacturing facility. This may enable poly-Si driven OLED displays to be manufactured or fabricated with a much lower cost.

The conventional poly-Si TFT is a top gate device. The fabrication process starts out with the deposition of critical Si thin film, which is crystallized to form a polycrystalline layer. Subsequent process steps include deposition, patterning, and etching of layers of gate dielectric (e.g., $SiO_2$), Si gate, implantation, activation, passivation layer (e.g., $SiO_2$), and metal interconnect to complete formation of poly-Si TFT. The poly-Si specific process steps include laser or solid phase crystallization and hydrogenation.

One disclosed feature of the embodiments is a bottom gate device. For a display backplane, the TFTs are built on top of all the metal interconnects and pixel electrodes. The last deposited layer is the channel Si layer, which may be patterned into isolated islands before going through the poly-Si specific process steps. This new process architecture is therefore referred to as a poly-last architecture because the poly-Si specific process steps are performed last. By separating the poly-Si specific process steps and putting them last, the new process architecture allows a-Si process steps to be performed first, followed by the poly-Si specific process steps. With this poly last architecture, a-Si and poly-Si backplanes may be produced in the same facility.

FIG. 1 is a diagram illustrating a display panel 100 according to one embodiment. The display panel 100 includes a panel 110 and a driver circuit 120. Note that the display panel 100 may include more or less than the above components.

The panel 110 includes a glass substrate and a display screen that has N pixels $130_i$ to $130_N$. The size of the panel may be any appropriate size such as 2.2" to more than 50". The panel 110 includes a TFT array which includes a number of TFTs as pixel switching devices on the glass substrate. Each pixel $130_j$ is switched on or off by a TFT $140_j$ (j=1, . . . , N). The pixels $130_i$ to $130_N$ and the associated TFTs $140_i$ to $140_N$ may be arranged in a two-dimensional array K×L where K and L are any suitable integers. The dimension K×L may be any appropriate dimension, such as 320×240, 640× 480, 1024×768, etc. Each of the TFTs $140_j$'s (j=1, . . . , N) may be fabricated using a poly-last process architecture. Each of the TFTs TFT $140_j$'s has a bottom gate structure with polycrystalline silicon. Each of the TFTs TFT $140_j$'s may have data interconnecting lines. The bottom gate structure and the data interconnecting lines may be under a silicon layer.

The driver circuit 120 may include peripheral driver circuits to drive the pixels $130_i$ to $130_N$ in the panel 110. The peripheral driver circuit may have a poly-last architecture. The driver circuit 120 may be off the shelf commercial devices or may be fabricated as part of the panel electronics. It may include a glass and row/column driver, a grey scale generator, a voltage drive generator, and a controller. The glass and row/column driver may include source and gate drivers having high voltage driving capability, data latch, shift register, digital-to-analog converters (DACs), etc. The controller may generate command and timing or clock signals to the glass and row/column driver. The grey scale generator may control the brightness and clarity of the pixels $130_i$ to $130_N$. The voltage drive generator may generate the necessary TFT drive voltages.

The panel 110 and the TFTs may be manufactured using a-Si process followed by poly-Si specific process steps. The process may include a series of steps as shown from FIG. 2 through FIG. 7. The a-Si process steps are shown in FIGS. 2 to 6, and the poly-Si process is shown in FIG. 7. Note that FIGS. 2 to 7 are for illustrative purposes, and do not include all the process steps. The process steps that are not shown are well known by one skilled in the art.

Figure 2:
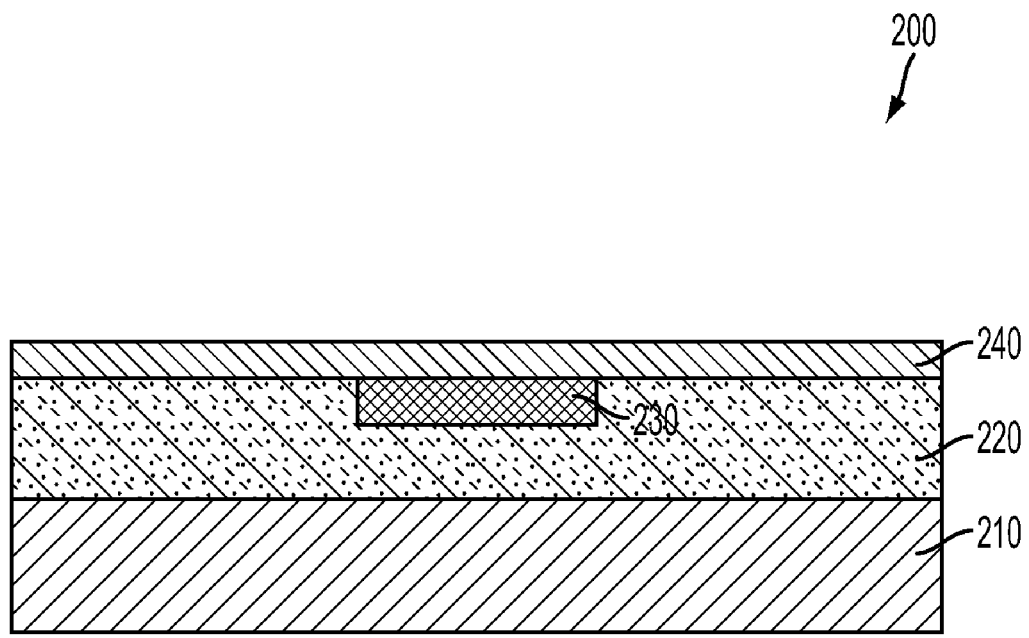
FIG. 2 is a diagram illustrating a process structure having a gate region according to one embodiment.

FIG. 2 is a diagram illustrating a process structure 200 having a gate region according to one embodiment. The process 200 includes a substrate 210, an insulator layer 220, a gate region 230, and a gate dioxide layer 240.

The substrate 210 may be a glass substrate, a flexible metal, or a plastic substrate. It may be made of a suitable glass material such as the Corning 1737 glass. Typically the substrate is prepared for TFT fabrication by a cleaning procedure. Then, the insulator layer 220 is deposited on the substrate 210. Then, a gate metal layer is deposited on the insulator layer 220. The gate metal layer may be any suitable metal layer such as molybdenum (Mo). It may be deposited by sputtering at room temperature. Then, the gate metal layer is patterned to produce the gate region 230. The patterning may be performed by conventional patterning techniques such as lithographic patterning with wet etching. The gate region 230 defines the gate of the TFT. Then, the gate dioxide layer 240 is deposited on the gate region.

Figure 3:
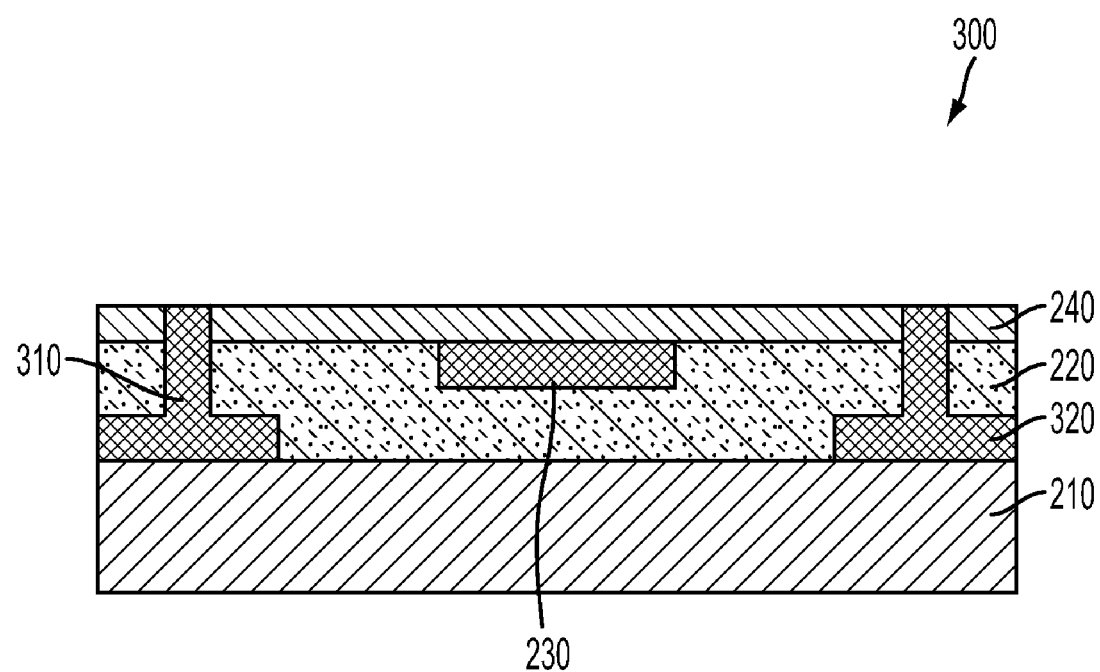
FIG. 3 is a diagram illustrating a process structure having source and drain contacts according to one embodiment.

FIG. 3 is a diagram illustrating a process structure 300 having source and drain contacts according to one embodiment. The process structure 300 includes source contact 310 and drain contact 320 in addition to the elements in the process structure 200. The source and drain contacts 310 and 320 are formed by etching the gate dioxide layer 240 and the insulator layer 220.

Figure 4:
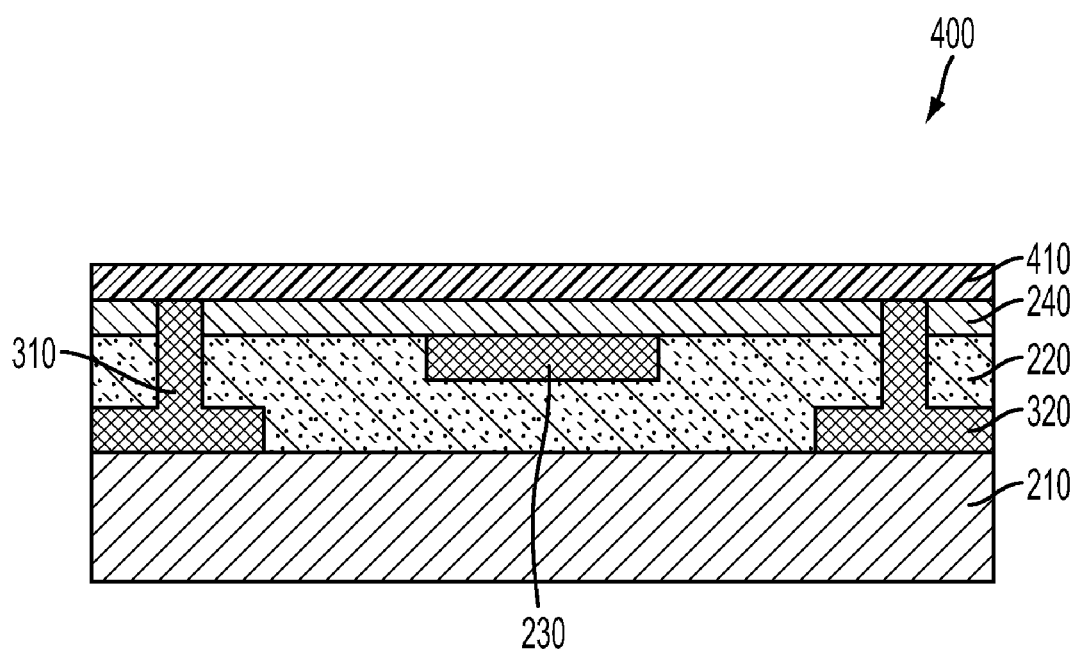
FIG. 4 is a diagram illustrating a process structure having a doped amorphous silicon layer according to one embodiment.

FIG. 4 is a diagram illustrating a process structure 400 having a doped amorphous silicon layer according to one embodiment. The process structure 400 includes a doped amorphous silicon layer 410 in addition to the elements in the process structure 300. The doped amorphous silicon layer 410 is deposited on the gate dioxide layer 240 and on the gate region 230, the source contact 310 and the drain contact 320, using PECVD, physical vapor deposition (PVD) such as sputtering, or low pressure chemical vapor deposition (LPCVP).

Figure 5:
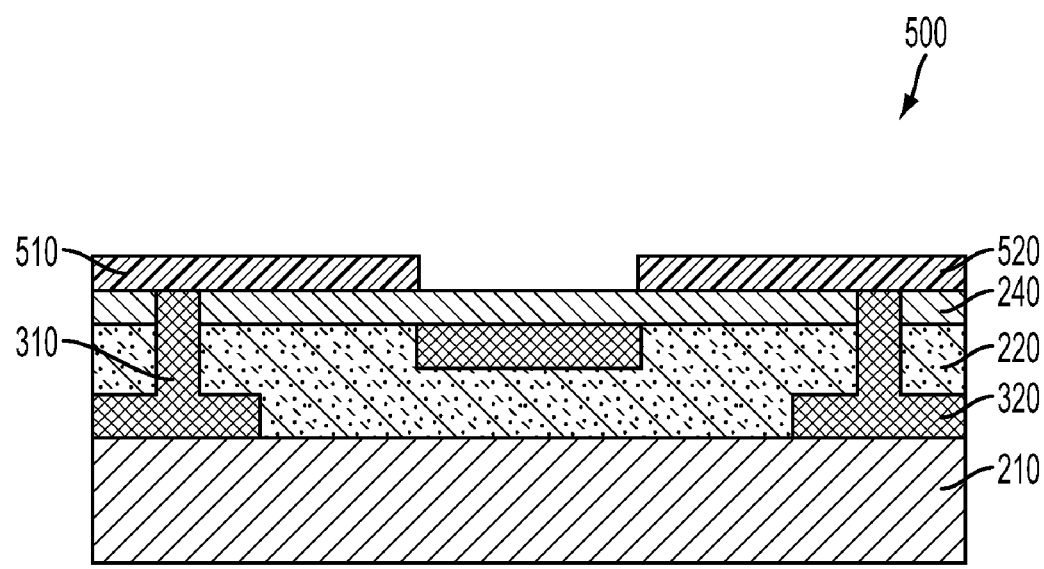
FIG. 5 is a diagram illustrating a process structure having patterned source and drain regions according to one embodiment.

FIG. 5 is a diagram illustrating a process structure 500 having patterned source and drain regions according to one embodiment. The process structure 500 includes patterned doped source and drain regions 510 and 520 in addition to the elements in the process structure 300 or 400. The doped source and drain regions 510 and 520 are formed by patterning the doped amorphous silicon layer 410. They are formed around the gate region 230.

Figure 6:
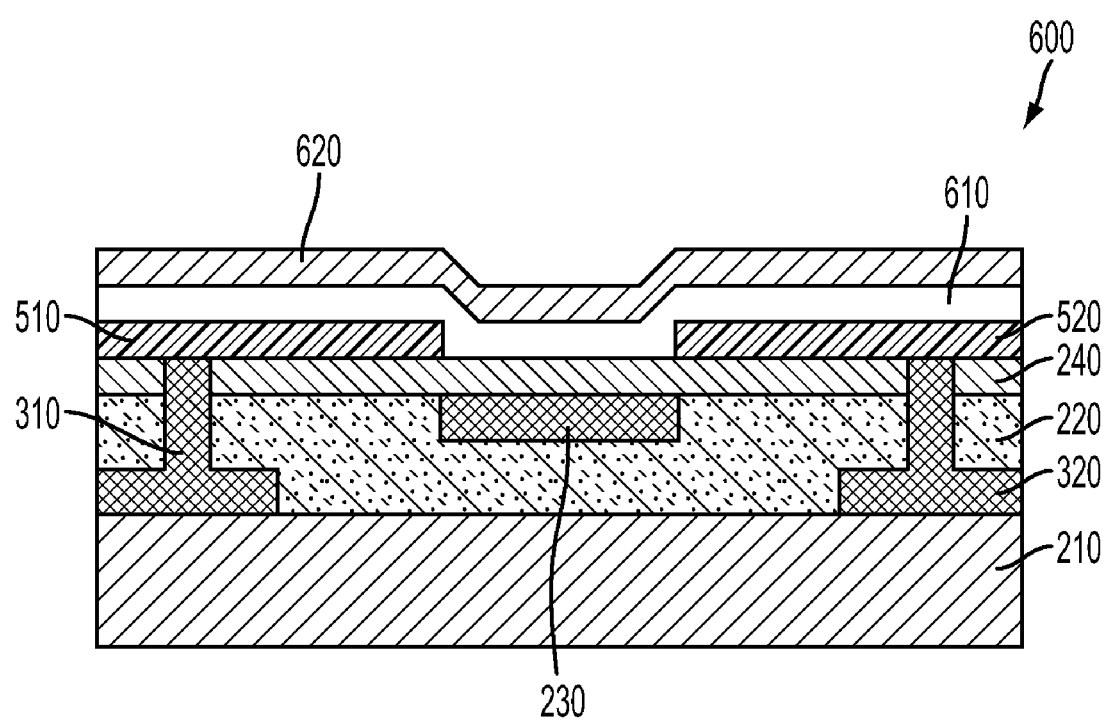
FIG. 6 is a diagram illustrating a process structure having a channel silicon precursor according to one embodiment.
Figure 7:
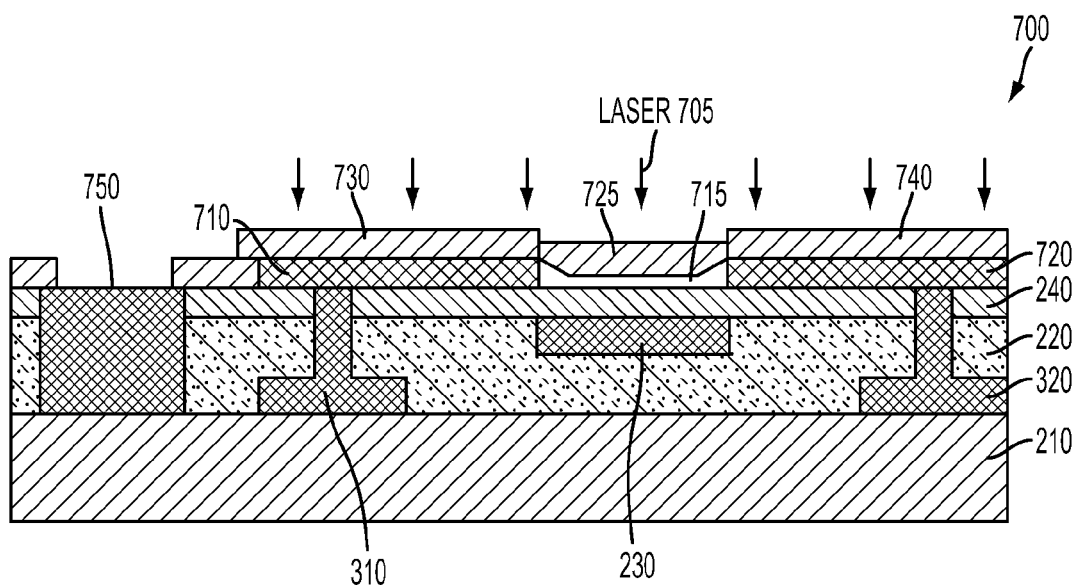
FIG. 7 is a diagram illustrating a process structure having polycrystalline silicon regions according to one embodiment.

FIG. 6 is a diagram illustrating a process structure 600 having a channel silicon precursor according to one embodiment. The process structure 600 includes a channel silicon precursor layer 610 and a passivation layer 620 in addition to the elements in the process structure 500. The channel silicon precursor layer 610 is deposited on the gate region 230, and the doped source and drain regions 510 and 520 using PECVD, PVD (e.g., sputtering), or LPCVP. The passivation layer 620 is deposited on the silicon precursor layer 610. The passivation layer 620 may be silicon oxide ($SiO_2$), silicon oxynitride (SiON), or any suitable material for passivation. The passivation layer 620 may serve to protect the silicon precursor layer 610 from contamination. The passivation layer 620 is then patterned and etched to expose the metal bond pads so that they may be integrated with the driver circuits.

The process structure 600 is the result of the last a-Si fabrication step. It is now poly-Si enabled and is ready for polycrystalline silicon or polycrystalline silicon compatible process. The process structure 600 may be further processed to further reduce the requirements of the poly-Si specific process. For example, the panel of the process structure 600 may be scribed or cut into a predetermined size, thus reducing the investment of large size chambers to hold the original substrates.

FIG. 7 is a diagram illustrating a process structure 700 having polycrystalline silicon regions according to one embodiment. The process structure 700 forms a crystallized intrinsic silicon channel region 715 and crystallized doped silicon regions 710 and 720 above the source and drain contacts 310 and 320 by irradiating the channel silicon precursor 610 by a laser 705. The crystallized intrinsic silicon channel region 715 is under a channel passivation layer 725. The crystallized doped silicon regions 710 and 720 are under passivation layers 730 and 740, respectively. The irradiation may crystallize the silicon under the passivation layer. Typically, the passivation layer covers the silicon channel region 715 and the source and drain silicon regions 710 and 720. The bond pads are typically larger and are at the periphery of the display. Therefore, the patterned and etched areas of the passivation layer are mainly at the edges as shown in the exposed contact pad 750. The silicon island includes the silicon channel region 715 and the source and drain silicon regions 710 and 720. The laser 705 may be any suitable laser such as an excimer laser. The laser 705 thermally anneals the amorphous silicon precursor 610 to form the polycrystalline regions 710 and 720 and the channel region 715 connecting the regions 710 and 720. The laser exposure time may be reduced. The TFT islands occupy only a small fraction of the pixel area (e.g., less than 10%). Therefore, the laser may be programmed to scan only the island area that contain the TFTs, resulting in a time saving of at least ten times.

Additional layers may be deposited before and after irradiating. For example, a thin molybdenum layer may be deposited on the precursor 610 to provide the 800-nm absorption absent in amorphous silicon. Then, a laser diode array having an 800-nm light may be used to scan the molybdenum layer. The laser energy absorbed in the molybdenum is transferred to the silicon precursor 610 which is annealed into the microcrystalline state. The molybdenum layer may then be etched off.

The process structure 700 is formed by using a poly-Si process steps. It may be processed in the same a-Si facility that forms the process structures shown from FIGS. 2 to 6. This a-Si facility needs only to have additional laser and hydrogenation tools and equipment. Alternatively, the process structure 700 may be formed in a poly-Si facility.

Figure 8:
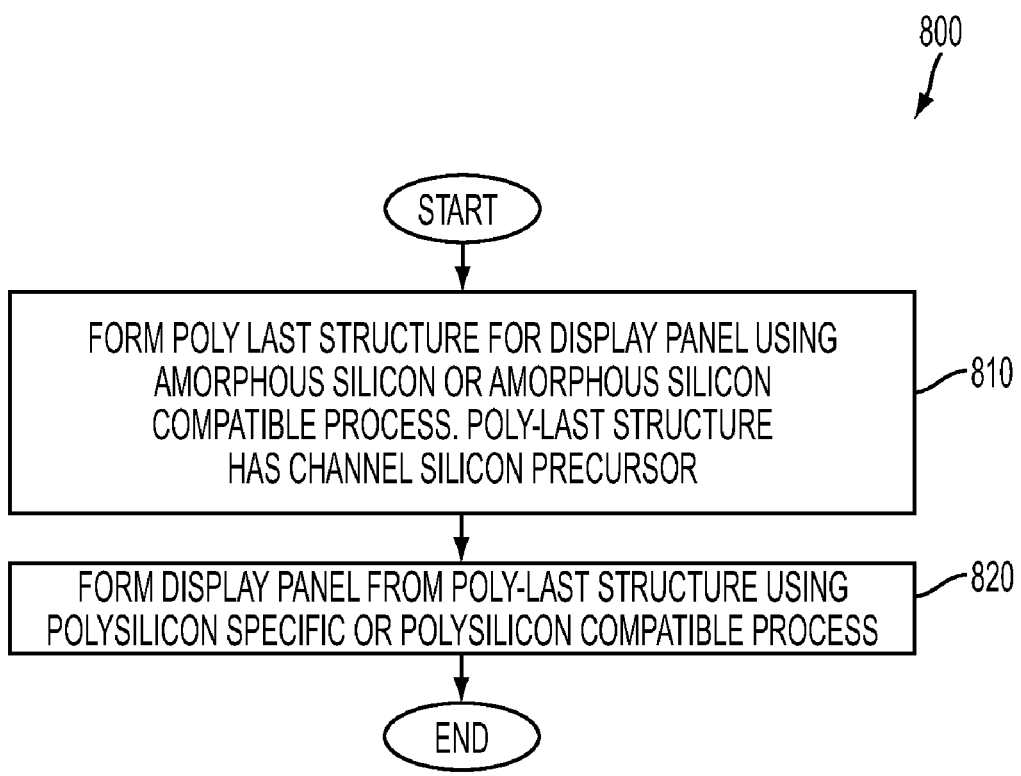
FIG. 8 is a flowchart illustrating a process to fabricate a display panel according to one embodiment.

FIG. 8 is a flowchart illustrating a process 800 to fabricate a display panel according to one embodiment.

Upon START, the process 800 forms a poly last structure for display panel using an amorphous silicon or amorphous silicon compatible process (Block 810). The poly-last structure has a channel silicon precursor. Next, the process 800 forms the display panel from the poly-last structure using a polysilicon specific process (Block 820). The process 800 is then terminated.

Figure 9:
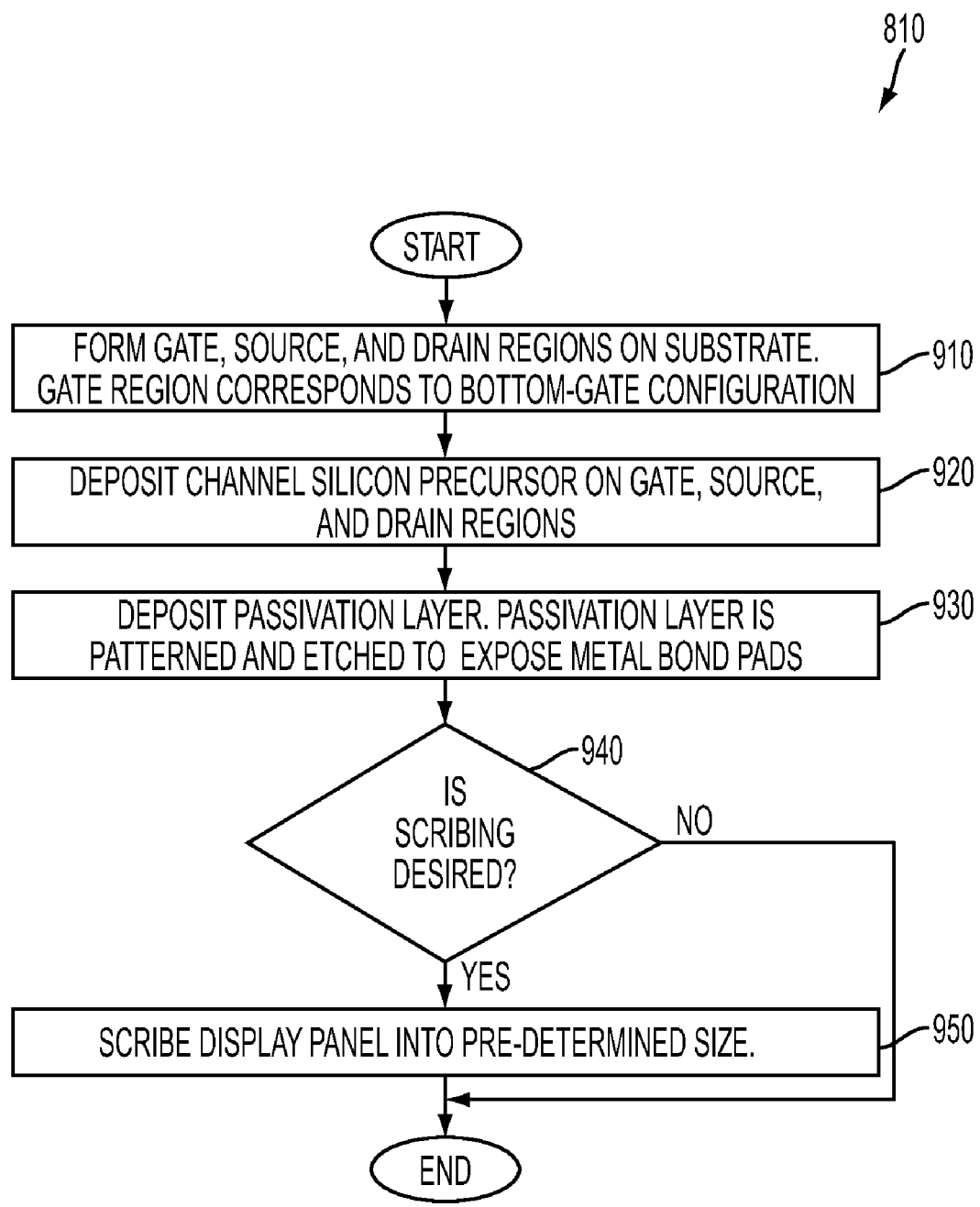
FIG. 9 is a flowchart illustrating a process to form a poly-last structure according to one embodiment.

FIG. 9 is a flowchart illustrating the process 810 shown in FIG. 8 to form a poly-last structure according to one embodiment.

Upon START, the process 810 forms gate, source, and drain regions on a substrate for a display panel using an amorphous silicon or amorphous silicon compatible process (Block 910). The gate region corresponds to a bottom gate configuration. The gate, source, and drain regions correspond to a TFT to switch a pixel in the display panel.

Next, the process 810 deposits a channel silicon precursor on the gate, source and drain regions in the amorphous silicon or amorphous silicon compatible process (Block 920). Then, the process 810 deposits a passivation layer on the channel silicon precursor (Block 930). The passivation layer is patterned and etched to expose metal bond pads for integration with other circuits such as the driver circuit. The result is a poly-last process structure that is ready to be processed by poly-Si specific process steps. Then, the process 810 determines if scribing is desired (Block 940). If not, the process 810 is terminated at the END. Otherwise, the process 810 scribes the display panel into a predetermined size (Block 950) and is then terminated at the END.

Figure 10:
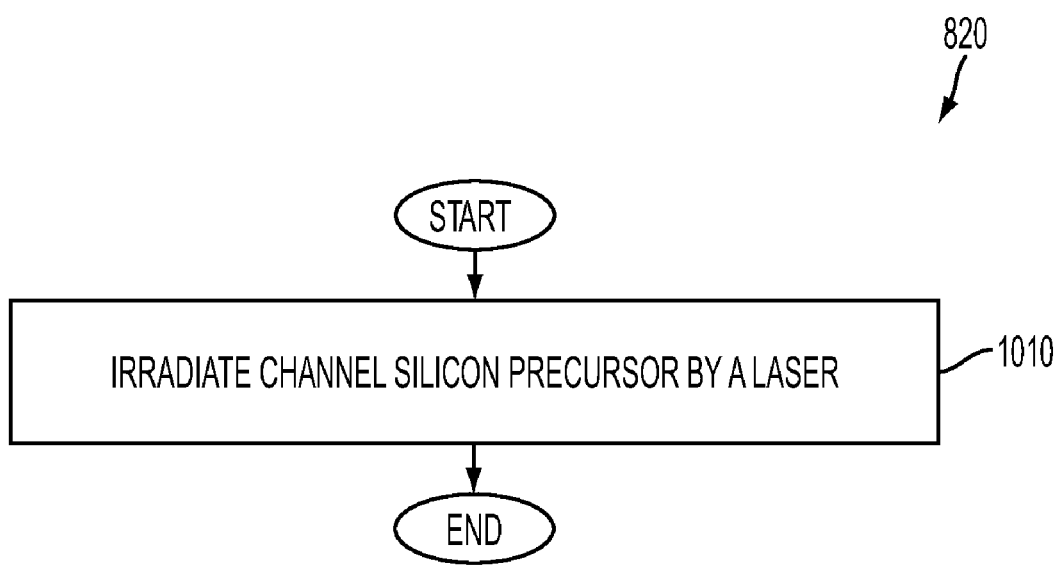
FIG. 10 is a diagram illustrating a process to form the display panel using polysilicon specific process according to one embodiment.

FIG. 10 is a diagram illustrating the process 820 shown in FIG. 8 to form the display panel using polysilicon specific process according to one embodiment.

Upon START, the process 820 irradiates the channel silicon precursor by a laser using a polycrystalline silicon or polycrystalline silicon compatible process (Block 1010). The irradiation of the channel silicon precursor may crystallize silicon under the etched passivation layer. Additional poly-Si process steps may be performed to produce the final TFT display panel. The process 800 is then terminated at the END.

Figure 11:
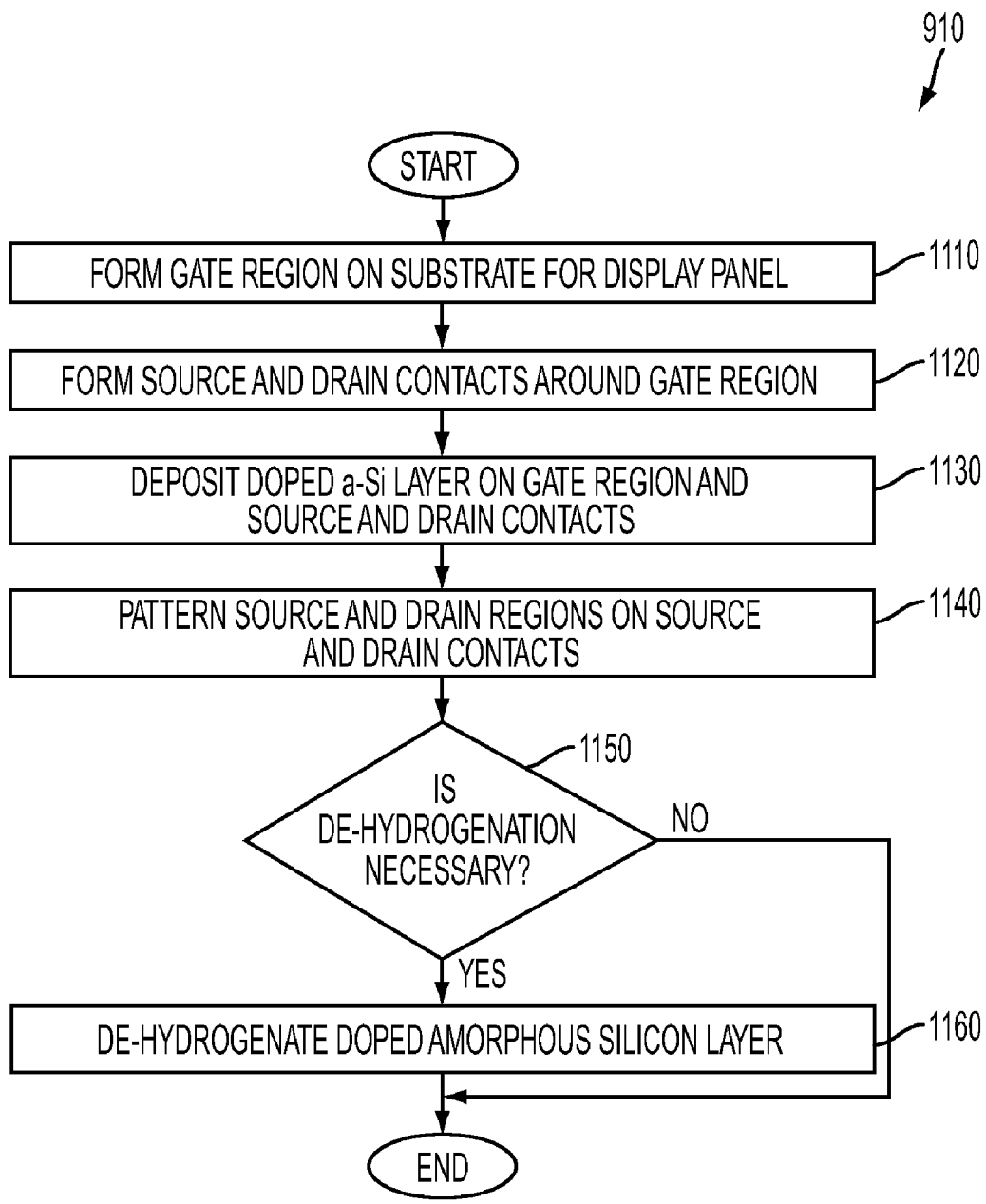
FIG. 11 is a flowchart illustrating a process to form gate, source, and drain regions according to one embodiment.

FIG. 11 is a flowchart illustrating the process 910 shown in FIG. 9 to form gate, source, and drain regions according to one embodiment.

Upon START, the process 910 forms a gate region on a substrate for a display panel (Block 1110). The substrate may be a glass substrate. Next, the process 910 forms source and drain contacts around the gate region (Block 1120). Then, the process 910 deposits a doped amorphous silicon layer on the gate region and the source and drain contacts (Block 1130). Next, the process 910 patterns source and drain regions on the source and drain contacts (Block 1140).

Then, the process 910 determines if de-hydrogenation is necessary (Block 1150). De-hydrogenation may be necessary to remove hydrogen atoms that may exist in the Si film during deposition of a-Si by PECVD at low temperature. If de-hydrogenation is not necessary, the process 910 is terminated. Otherwise, the process 910 de-hydrogenates the doped amorphous silicon layer (Block 1160). The process 910 is then terminated at the END.

Figure 12:
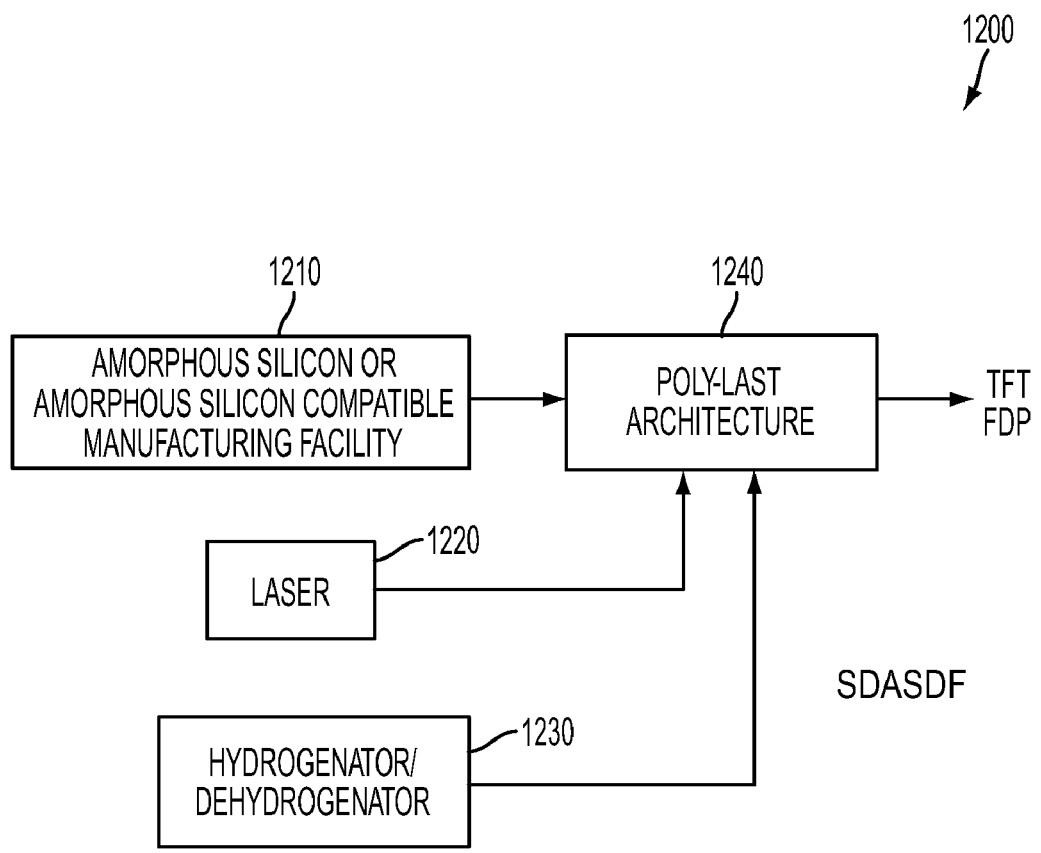
FIG. 12 is a diagram illustrating a manufacturing facility to fabricate display panels according to one embodiment.

FIG. 12 is a diagram illustrating a manufacturing facility 1200 to fabricate display panels according to one embodiment. The manufacturing facility 1200 includes an amorphous silicon or amorphous silicon compatible manufacturing facility 1210, a laser 1220, and a hydrogenator/dehydrogenator 1230. The manufacturing facility 1200 may include more or less than the above components.

The amorphous silicon or amorphous silicon compatible manufacturing facility 1210 includes equipment, tools, process mechanisms, and accessories that may be suitable for manufacturing a-Si TFT display panels. It may include glass preparation, patterning or lithographic equipment, deposition and/or sputtering equipment (e.g., PECVD), encapsulation, test, sorting, packing, and shipping equipment. The amorphous silicon or amorphous silicon compatible manufacturing facility 1010 produces a poly-last process architecture 1040 which is further subjected to poly-Si process steps.

The laser 1220 may include any suitable laser equipment such as excimer laser, diode-pumped solid state laser, high power diode array, etc. to perform poly-Si crystallization on the poly-last process architecture 1240.

The hydrogenator/dehydrogenator 1230 may include any tool or equipment to introduce hydrogen into amorphous silicon to passivate the Si dangling bonds and to remove any residual hydrogen after processing. The hydrogenator typically includes a plasma chamber using hydrogen containing process gas.

The amorphous silicon or amorphous silicon compatible manufacturing facility 1210, the laser 1220, and the hydrogenator/dehydrogenator 1230 produce a TFT Flat Display Panel (FDP) from the poly-last architecture 1240.

Figure 13:
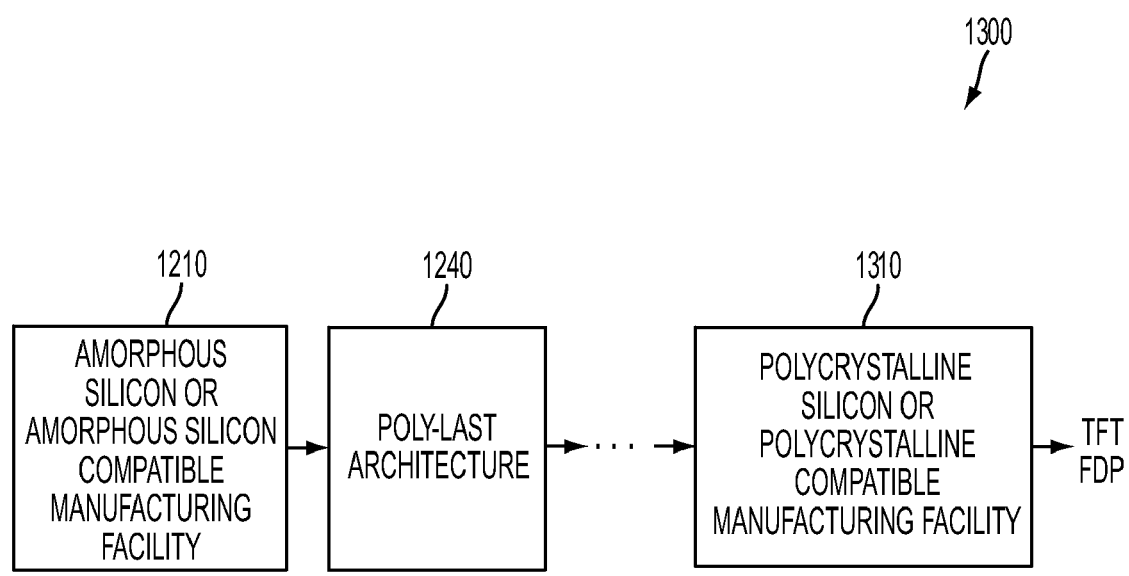
FIG. 13 is a diagram illustrating manufacturing facilities to fabricate display panels according to one embodiment.

FIG. 13 is a diagram illustrating manufacturing facilities 1300 to fabricate display panels according to one embodiment. The manufacturing facilities 1300 include an amorphous silicon or amorphous silicon compatible manufacturing facility 1210 and a polycrystalline silicon or polycrystalline silicon compatible manufacturing facility 1310.

The amorphous silicon or amorphous silicon compatible manufacturing facility 1210 is similar to the amorphous silicon or amorphous silicon compatible manufacturing facility 1210 shown in FIG. 12. It may be any existing amorphous silicon or amorphous silicon compatible facility. The process steps follow the process steps described above to provide a poly-last process architecture 1240 as described above.

The poly-last process architecture 1240 may then be shipped to the polycrystalline silicon or polycrystalline silicon compatible manufacturing facility 1310 to complete poly-Si specific steps to produce the TFT FDP. Since major process steps have already been performed in the silicon manufacturing facility 1010, the polycrystalline silicon or polycrystalline silicon compatible manufacturing facility 1310 may only perform the remaining poly-Si specific steps such as crystallization. Accordingly, the processing time may be reduced. The polycrystalline silicon or polycrystalline silicon compatible manufacturing facility 1310 may be separately owned and operated by a different entity as a client service model.

It will be appreciated that various of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

What is claimed is:

1. A poly-last structure comprising:
   a substrate;
   a bottom gate deposited on the substrate;
   a dielectric layer deposited on the bottom gate;
   a doped source and drain regions deposited on the substrate and formed around the bottom gate; and
   a channel silicon precursor layer deposited on a patterned doped amorphous silicon layer and the dielectric layer.

2. The poly-last structure of claim 1 wherein the substrate is a glass substrate, a flexible metal, or a plastic substrate.

3. The poly-last structure of claim 1 wherein the doped amorphous silicon layer has a low concentration of hydrogen atoms.

4. The poly-last structure of claim 1 further comprising a passivation layer on the channel silicon precursor layer.

5. A flat panel display comprising:
   a substrate; and
   a thin film transistor (TFT) array having a plurality of TFTs as pixel switching devices on the substrate, each of the TFTs having a bottom gate structure with polycrystalline silicon and data interconnecting lines, the bottom gate structure and the data interconnecting lines being under a silicon layer.

6. The flat panel display of claim 5 further comprising:
   a peripheral driver circuit coupled to the TFT array to drive the pixel switching devices, the peripheral driver circuit having a poly-last architecture.

7. The flat panel display of claim 5 wherein the substrate is a glass substrate, a flexible metal, or a plastic substrate.

8. The flat panel display of claim 5 wherein the bottom gate structure comprises:
   a bottom gate deposited on the substrate;
   a dielectric layer deposited on the bottom gate;
   doped source and drain regions deposited on the substrate and formed around the bottom gate; and
   a channel silicon precursor layer deposited on a patterned doped amorphous silicon layer and the dielectric layer.

9. The flat panel display of claim 8 wherein the doped amorphous silicon layer has a low concentration of hydrogen atoms.

10. The flat panel display of claim 8 wherein the bottom gate structure further comprises a passivation layer on the channel silicon precursor layer.

* * * * *